(12) United States Patent
Kimbrough

(10) Patent No.: US 6,609,842 B1
(45) Date of Patent: Aug. 26, 2003

(54) LINEAR LASER DRIVER CIRCUIT

(75) Inventor: Mahlon D. Kimbrough, Bedford, TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/536,047

(22) Filed: Mar. 27, 2000

(51) Int. Cl.$^7$ ............................................. H04B 10/04
(52) U.S. Cl. ...................................... 398/195; 398/194
(58) Field of Search ................................. 359/187, 188; 372/33, 38.01, 38.02; 398/195, 194

(56) References Cited

U.S. PATENT DOCUMENTS

| | | | |
|---|---|---|---|
| 4,553,268 A | 11/1985 | Tilly | |
| 4,757,193 A | 7/1988 | Kollanyi | |
| 5,349,595 A | 9/1994 | Ogawa et al. | |
| 5,402,433 A | * 3/1995 | Stiscia | 372/31 |
| 5,675,599 A | 10/1997 | Abe et al. | |
| 5,732,096 A | 3/1998 | Suzuki et al. | |
| 5,752,100 A | * 5/1998 | Schrock | 396/129 |
| 5,761,230 A | 6/1998 | Oono et al. | |
| 5,778,017 A | 7/1998 | Sato et al. | |
| 5,793,789 A | 8/1998 | Ben-Michael et al. | |
| 5,796,767 A | 8/1998 | Aizawa | |
| 5,963,570 A | * 10/1999 | Gnauck et al. | 372/38.01 |
| 6,002,699 A | 12/1999 | Gotoh | |
| 6,021,143 A | 2/2000 | Ransijn et al. | |

FOREIGN PATENT DOCUMENTS

| | | | |
|---|---|---|---|
| EP | 90314191.9 | 6/1991 | |
| WO | WO97/01202 | * 1/1997 | ........... H01S/3/133 |

OTHER PUBLICATIONS

E. Säckinger et al., "A 15–mW, 155–Mb/s CMOS Burst–Mode Laser Driver with Automatic Power Control and End–of–Life Detection", IEEE Journal of Solid–State Circuits, vol. 35, No. 2, Feb. 2000.*
Patent Abstracts of Japan, vol. 1998, No. 08, Jun. 30, 1998; & JP 10 076705 A (Toshiba Corp) Mar. 24, 1998 Abstract.
Patent Abstracts of Japan, vol. 1997, No. 08, Aug. 29, 1997; & JP 09 102646 A (Oki Electric Ind Co Ltd) Apr. 15, 1997 Abstract.
Patent Abstracts of Japan, vol. 005, No. 145, Sep. 12, 1981; & JP 56 078248 A (Mitsubishi Electric Corp) Jun. 27, 1981 Abstract.

* cited by examiner

Primary Examiner—Jason Chan
Assistant Examiner—Shi K. Li
(74) Attorney, Agent, or Firm—Jones Day

(57) ABSTRACT

A linear laser diode driver circuit is provided in which a solid state laser diode and its back-facet photodiode are configured into the feedback loop of a high-speed operational amplifier. In this configuration, the light output from the laser diode is directly proportional to the input voltage to the operational amplifier and is independent of the laser diode's temperature characteristics.

11 Claims, 4 Drawing Sheets

LINEAR LASER DRIVER CIRCUIT

BACKGROUND OF THE INVENTION

1. Technical Field

The present invention is directed toward the field of optical communication circuits using laser diodes. More specifically, the invention provides a linear laser driver circuit that is particularly well-suited for use in driving a laser diode for use with an optical communication system. As part of such a system, the laser diode is pulsed on and off at a very high frequency in order to communicate pulses of light over an optical fiber.

2. Description of the Related Art

Laser diodes and their associated driving circuitry are known in this field. Laser diodes are characterized by a temperature dependent threshold current $I_{TH}$, above which point the diode begins to act like a laser. FIG. 1, for example, is a plot 10 showing the typical light output (P) 12 v. current (I) 14 characteristic for a laser diode at two operating temperatures 16, 18. As seen in this plot 10, the laser diode threshold current $I_{TH}$ is lower $I_{TH1}$ at the lower temperature than at the higher temperature, where the threshold current is $I_{TH2}$. The Quantum Efficiency (QE) of the diode is characterized by the slope of the P v. I curve.

Simple laser driver circuits turn the laser diode on and off for each pulse of light to be transmitted over the fiber. FIG. 2 is a plot 20 showing a plurality of light pulses output from such a laser driver circuit. The y-axis in this plot shows light output (P) 22, and the x-axis shows time (t) 24. As seen in this plot 20, the problem with this type of simple on/off driver circuit is that it causes the laser diode to cross over the laser threshold current level ($I_{TH}$), which causes a ringing phenomenon 26 to occur on the output pulse that consists of a plurality of light spikes. These light spikes are caused by the laser transitioning from operating like a light emitting diode to operating like a laser. After a short burst, these spikes 26 subside, and the output pulse is relatively flat 28, until the pulse terminates.

In order to cure the problem shown in FIG. 2, more complex laser driver circuits have been used in this field that typically include two feedback loops. The first loop regulates the laser diode's average light output and maintains the laser above the threshold current level ($I_{TH}$) even during off periods. This eliminates the ringing phenomenon shown in FIG. 2 since the diode is always above the threshold current. The second feedback loop is used to regulate the modulation index, and requires a complex analog gain control stage to adjust the laser diode's extinction ratio $E_R$. Often, these feedback circuits require temperature compensation thermistors and multiple factory adjustments to control the extinction ratio.

SUMMARY OF THE INVENTION

A linear laser diode driver circuit is provided in which a solid state laser diode and its back-facet photodiode are configured into the feedback loop of a high-speed operational amplifier. In this configuration, the light output from the laser diode is directly proportional to the input voltage to the operational amplifier and is independent of the laser diode's temperature characteristics.

The linear laser driver circuit has the advantage that it can transmit optical pulses that are bandwidth limited and spectrally shaped. In one embodiment of the invention, the linear laser driver can be coupled to a spectral-shaping low pass filter, such that the input pulse train can be first sent through the spectral-shaping low pass filter in order to limit the bandwidth before driving the laser. This filtering allows much greater control of spectral components in the output signal (and hence much greater control over noise) than can be accomplished using external wave shaping components such as ferrite beads. With such a low pass filter, the spurious frequency components can be filtered by any arbitrary amount (such as 50 dB below the fundamental components), in order to spectrally shape the input signal to the linear laser driver.

One aspect of the invention provides a laser diode communication circuit, comprising: (1) an input pulse communication signal; (2) a laser diode having a back-facet photodiode for monitoring the output light signal from the laser diode; (3) a current source coupled to the laser diode; and (4) a first operational amplifier having an input coupled to the input pulse communication signal and an output coupled to the current source for causing the current source to supply current to the laser diode in relation to the input pulse communication signal, wherein the laser diode and its back-facet photodiode are configured in a feedback loop between the output and the input of the first operational amplifier.

Still another aspect of the invention provides a laser diode communication circuit, comprising: (1) a laser diode having a back-facet photodiode for monitoring the light output from the laser diode; (2) a fiber optical cable coupled to the laser diode for communicating light output signals from the laser diode; (3) an input pulse communication signal; and (4) a linear laser diode driver circuit having an input node, a current drive output node, and a feedback node, wherein the input node of the linear driver circuit is coupled to the input pulse communication signal, the current drive output node is coupled to the laser diode for driving the laser with a particular current level, and the feedback node is coupled to the back-facet photodiode of the laser diode, such that the laser diode is configured in a feedback loop between the current drive output node and the feedback node of the linear driver circuit.

These are just a few of the many aspects of the invention, which are detailed below in reference to the attached drawing figure. Other aspects and variations thereof will be apparent to one of ordinary skill in this field upon reviewing this application.

The present invention provides many advantages, such as: (1) eliminates the need for thermisters and extinction ratio factory adjustments; (2) low cost; (3) easier to manufacture; (4) automatic compensation of laser variation over temperature and time; (5) simpler circuitry; (6) provides linear light output versus control voltage; (7) provides precision control of light on/off levels; (8) eliminates spurious laser emissions; and (9) eliminates the need for external wave-shaping components.

These are just a few of the many advantages of the present invention, which is described in more detail below in terms of the preferred embodiments. Not all of these advantages are required to practice the invention, and this listing is provided simply to illustrate the numerous advances provided by the invention. As will be appreciated, the invention is capable of other and different embodiments, and its several details are capable of modifications in various respects, all without departing from the spirit of the invention. Accordingly, the drawings and description of the preferred embodiments set forth below are to be regarded as illustrative in nature and not restrictive.

BRIEF DESCRIPTION OF THE DRAWINGS

The present invention provides many advantages over presently known systems and methods in this field, as will become apparent from the following description when read in conjunction with the accompanying drawings, wherein.

These drawing figures present one or more preferred embodiments. These preferred embodiments, which are described in detail below, are presented by way of example, and are not meant to limit the scope of the claimed invention.

DETAILED DESCRIPTION OF THE DRAWINGS

Figure 1:
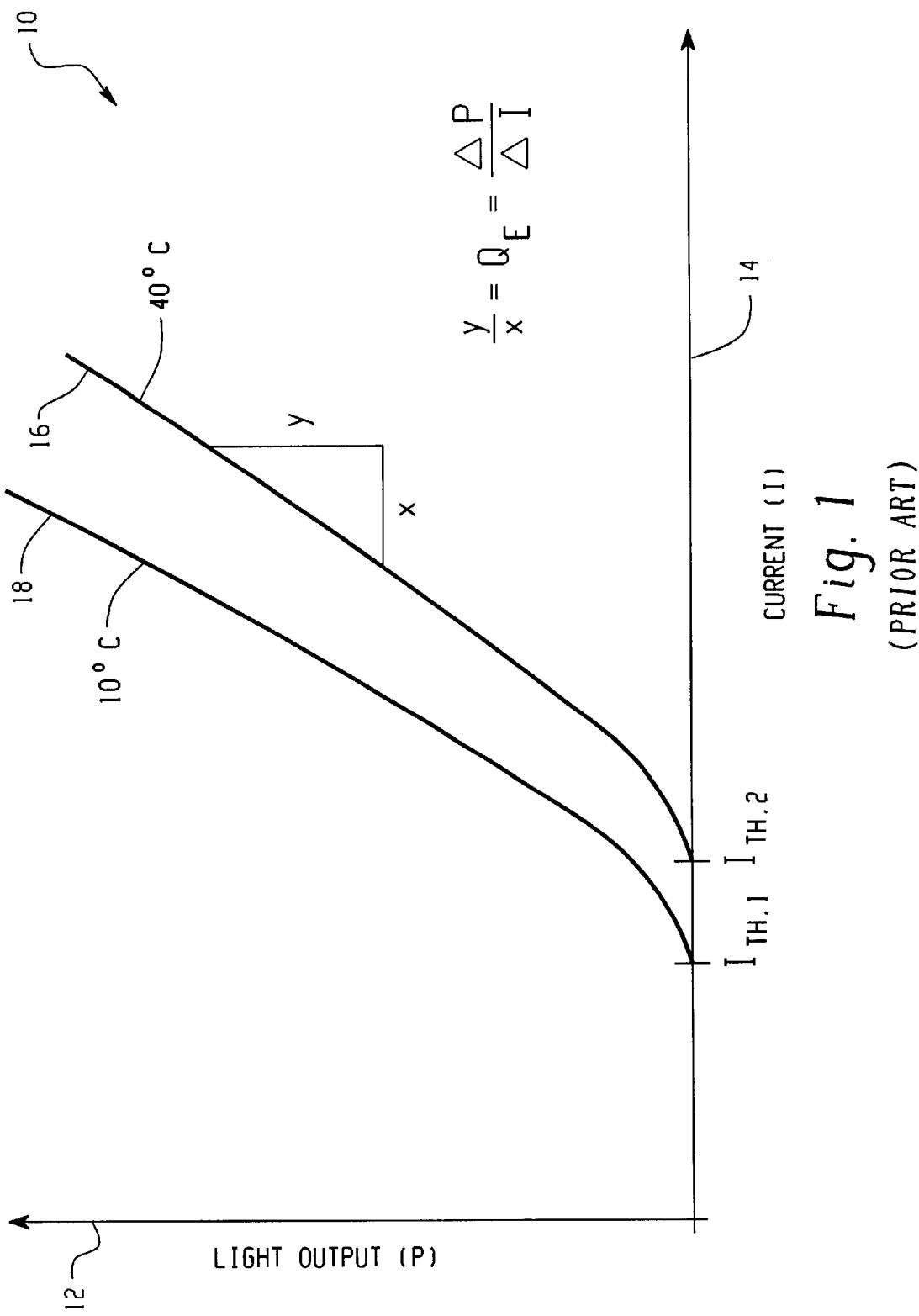
FIG. 1 is a plot showing the typical light output (P) v. current (I) characteristic for a laser diode at two operating temperatures.
Figure 2:
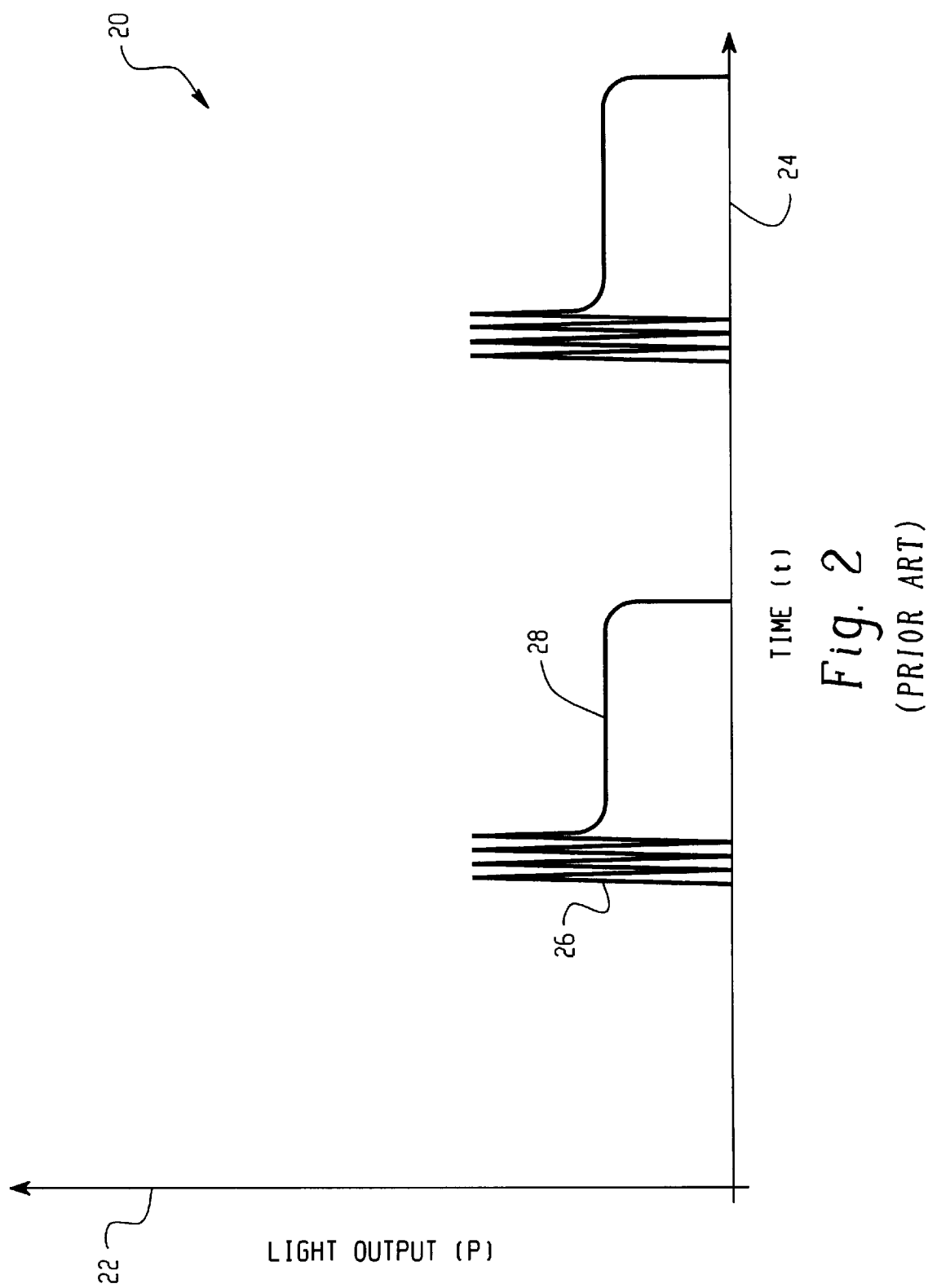
FIG. 2 is a plot showing a plurality of light pulses output from a typical prior art laser driver circuit showing a ringing phenomenon on the rising edge of the pulse.
Figure 3:
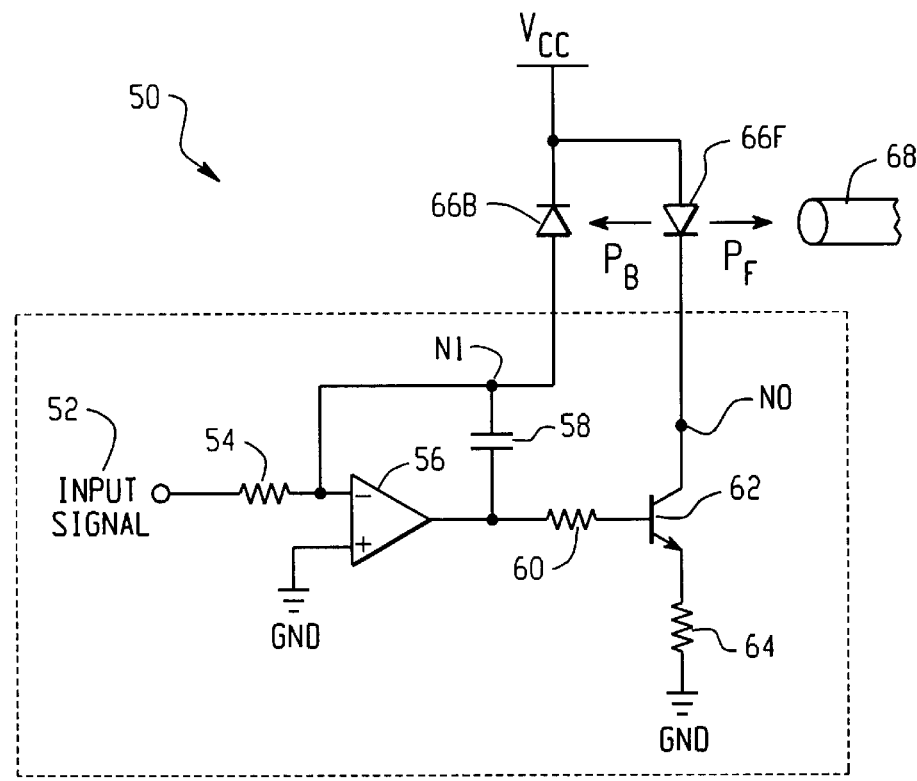
FIG. 3 is a circuit schematic showing a linear laser driver circuit according to one embodiment of the present invention.

Turning now to the drawing figures, FIG. 3 is a circuit schematic showing a linear laser driver circuit 50 according to one embodiment of the present invention. The drive circuit 50 is used to control the current level through a laser diode 66F. The laser diode 66F includes a back-facet photodiode 66B. The laser diode 66F communicates pulses of light $P_F$ over an optical communication fiber 68. The laser diode 66F also communicates an attenuated pulse of light $P_B$ to the back-facet photodiode 66B, which is used to monitor the operation of the laser diode 66F, and can be used as a control mechanism to detect the operational state of the laser diode 66F. The anodes of the laser diode 66F and the integrated back-facet photodiode 66B are coupled to the positive power supply, VCC. The cathode of the laser diode 66F is coupled to the current drive output node N0 of the linear laser driver circuit 50, and the cathode of the back-facet photodiode 66B is coupled to the feedback control input node N1 of the linear laser driver circuit 50.

The other input to the linear laser driver circuit 50 is used for receiving an input signal 52. This input signal represents the pulse characteristic desired to be output by the laser diode 66F. The input signal 52 is coupled through a resistor 54 to the inverting input of operational amplifier 56. The non-inverting input of the op-amp 56 is tied to ground. The output of the op-amp 56 is coupled through resistor 60 to the base of current-drive NPN bipolar transistor 62. The bipolar junction transistor (BJT) 62 provides the drive current for the laser diode 66F, and its emitter is coupled to ground through resistor 64. Thus, the current drive pulled by BJT 62 is equal to the voltage output by the op-amp 56 less the $V_{BE}$ of the BJT, divided by the sum of resistors 60 and 64. This current level causes the laser diode 66F to lase at a particular output light level (P). This output light level (P) is detected by back-facet photodiode 66B and a proportional voltage is applied to the inverting input of the op-amp through node N1. An optional compensation capacitor 58 is coupled between the output and the inverting input of the op-amp 56. By configuring the laser diode 66F and its back-facet photodiode into the feedback loop of a high-speed operational amplifier 56, the light output from the laser diode 66F is made directly proportional to the input voltage 52 to the operational amplifier 56 and is independent of the laser diode's 66F temperature characteristics.

More specifically, the linear laser driver circuit 50 operates as follows. The circuit 50 includes an inverting input 52 for receiving an input signal. For positive inputs, there is very little, if any, light output from the laser (P0). For negative signals, the laser light should be directly proportional to the negative signal voltage (P1). As the input signal 52 goes negative, the operational amplifier 56 outputs a positive signal on the base of the NPN transistor 62. This positive signal will start turning on the NPN transistor 62, thereby causing current to flow through the laser diode 66F and into the emitter resistor 64. The laser current is directly proportional to the base voltage minus the base-emitter bias voltage. As the laser current increases, the light from the laser 66F will cause current to flow through the back-facet diode 66B. When the current through the back-facet diode 66B is equal to the input signal 52 divided by the input resistor 54, then the voltage on the operational amplifier's 56 negative input will be equal to the positive input and the circuit will be at equilibrium and no further increase in laser current will be required.

Subsequently, if the input signal 52 is changed to a proportionately more negative voltage, the laser output $P_F$ will increase by the same proportion due to the closed loop feedback path. Thus the operational amplifier feedback path causes the laser light output to be in direct proportion to the negative input signal 52. This prevents variations in the laser threshold current ($I_{TH}$) and quantum efficiency (QE) from changing the optical output of the circuit. Due to the delay in the feedback path and various parasitic capacitances, an optional compensation capacitor 58 may be used to stabilize the circuit.

Figure 4:
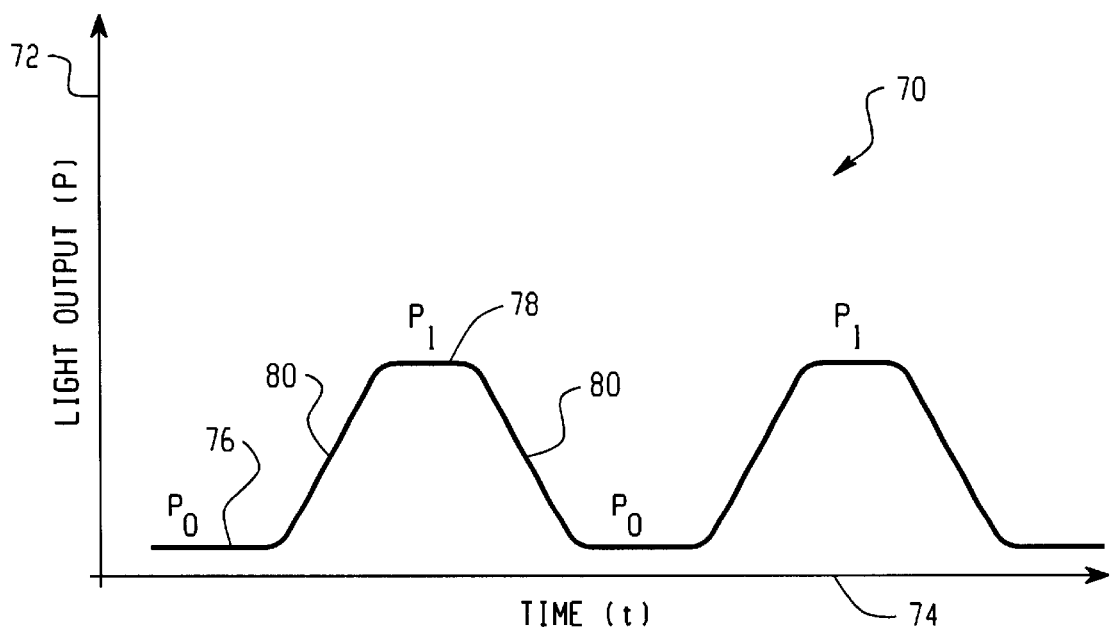
FIG. 4 is a plot showing a plurality of light pulses output from the circuit shown in FIG. 4.

FIG. 4 is a plot 70 showing a plurality of light pulses output from the circuit 50 shown in FIG. 3. In this plot, light output (P) is shown on the y-axis and time (t) on the x-axis 74. The plot 70 shows a smoothly varying waveform that has a floor at some power level P0 that is above the threshold level of the laser diode, and smoothly varies 80 to a high power level P1 78. Such an output waveform is generated by applying an input signal 52 to the linear laser driver circuit 50 that is identical in shape to the output waveform, but inverted. A circuit that can be used to create such a spectrally-shaped waveform is shown in FIG. 5.

Figure 5:
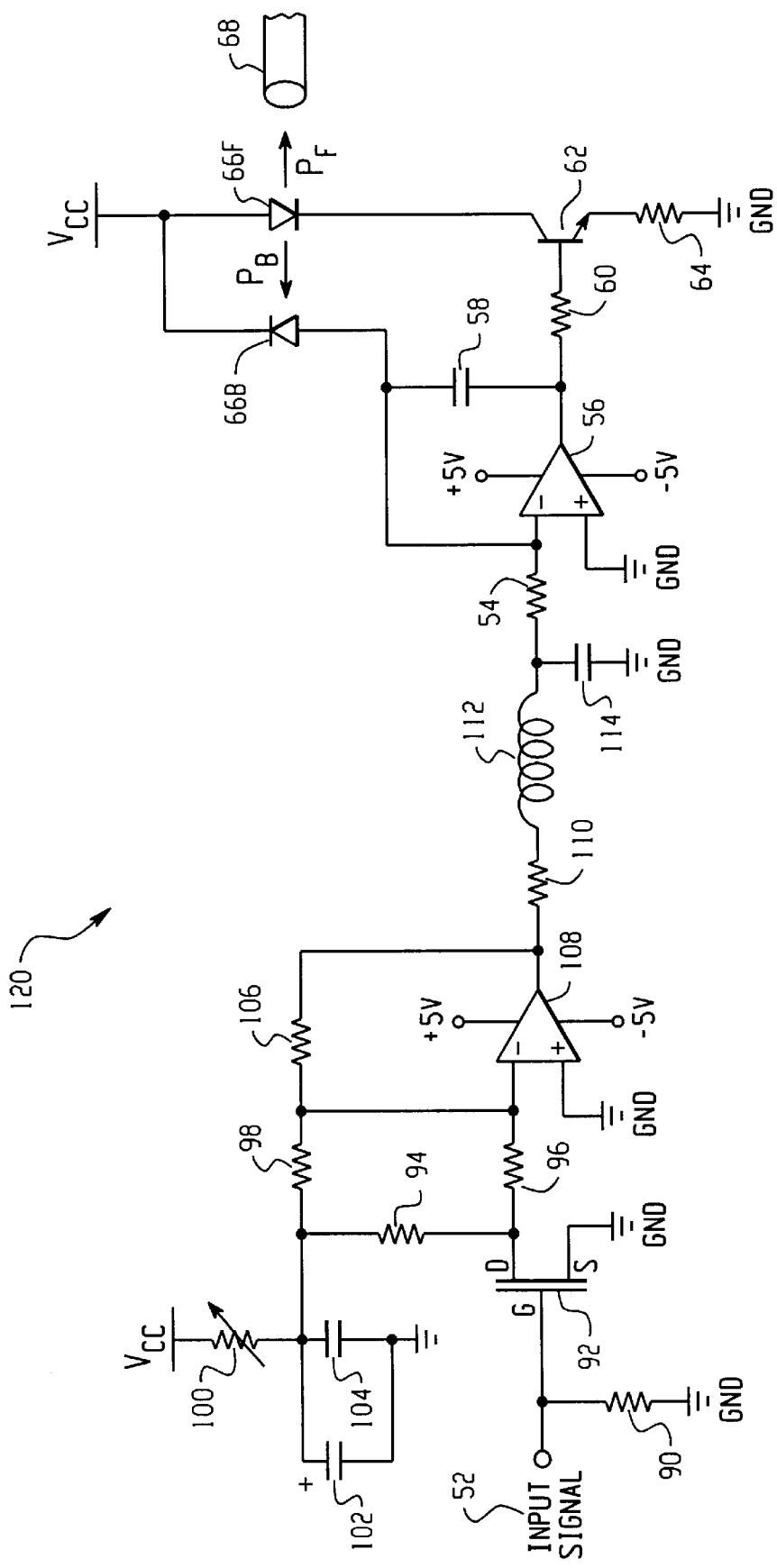
FIG. 5 is a circuit schematic showing a two-stage linear laser driver circuit according to an embodiment of the present invention.

FIG. 5 is a circuit schematic showing a two-stage linear laser driver circuit 120 according to an embodiment of the present invention. The output stage (elements 54–68) is identical to the circuit 50 described above. The input stage is used to produce a variable-amplitude bandwidth-limited spectrally-shaped signal to drive the output stage. The input stage is coupled to the input signal 52. This input signal is coupled to the gate of FET 92, and a resistor 90 is coupled between the gate node and ground. The source of the FET 92 is coupled to ground also. The drain of the FET 92 is coupled to the inverting input of operational amplifier 108 through resistor 96. Also coupled to the inverting input of the op-amp 108 is the RC network 102, 104 100, 98, and 94. Although a potentiometer 100 is shown in FIG. 5, this circuitry may be replaced with a variable pulse width modulator to set the voltage on the capacitors 102, 104 in the RC network. The non-inverting input of the op-amp 108 is coupled to ground. The output of the op-amp 108 is coupled through a resistor 110 and inductor 112 and coupled to the output stage (54–68). The output of the op-amp 108 is also coupled to its inverting input through resistor 106.

The input stage operates as follows. The data signal 52 is driven into the gate of an enhancement mode FET 92. When the digital signal 52 is low, the FET 92 will turn off and the current will flow through the two resistors 94, 96 into the inverting input of the op-ap 108. When the digital signal 52 is positive, the FET 92 turns on and shorts the signal on the drain to ground. This leaves current flowing through the resistor 98 flowing into the inverting input of the op-amp 108. Preferably, the ratio of the resistor 98 to the sum of the resistors 94 and 96 is 10 to 1. This 10 to 1 ratio causes a 10 to 1 ratio in the current through the resistors. The operational amplifier 108 acts as an inverting amplifier due to the feedback resistor 106. Thus the voltage output from the op-amp 108 pulses between two negative voltages with a 10 to 1 voltage ratio. This negative signal is passed through a lowpass filter 110, 112 to spectrally limit the signal driving the output stage. In this filter, a Bessel filter function is used to eliminate overshoot that could turn off the laser.

Although not limiting the present invention in any way, the following is a list of preferred elements for some of the circuit components shown in FIG. 5. Other component values and elements could be used in place of those shown in FIG. 5. Resistor 90 is 10 kohms. FET 92 is a 2N7002. Capacitor 102 is 10 microfarads. Capacitor 104 is 0.1 microfarads. Potentiometer 100 is 20 kohms. Resistors 94 and 96 are 4.99 kohms. Resistor 98 is 100 kohms. Resistor 106 is 4.99 kohms. Resistor 110 is 301 ohms. Inductor 112 is 22 nanohenrys. Op-Amps 108 and 56 are CLC 425 type. Capacitor 114 is 180 picofarads. Resistor 54 is 4.99 kohms. Resistors 60 is 301 ohms. NPN transistor 62 is a 2N222 type. Resistor 64 is 40 ohms.

The preferred embodiments described with reference to the attached drawing figures are presented only to demonstrate certain examples of the invention. Other elements, steps, methods and techniques that are insubstantially different from those described above and/or in the appended claims are also intended to be within the scope of the invention.

What is claimed:

1. A laser diode communication circuit, comprising:
   an input pulse communication signal;
   a laser diode having a back-facet photodiode for monitoring the output light signal from the laser diode;
   a current source coupled to the laser diode;
   a first operational amplifier having an input coupled to the input pulse communication signal and an output coupled to the current source for causing the current source to supply current to the laser diode in relation to the input pulse communication signal, wherein the laser diode and its back-facet photodiode are configured in a feedback loop between the output and the input of the first operational amplifier; and
   a spectral-shaping low-pass filter coupled between the input pulse communication signal and the input to the first operational amplifier, wherein the spectral-shaping low-pass filter creates a spectrally-shaped, bandwidth-limited input signal to the first operational amplifier that, when applied to the laser diode through the current source, provides a low-noise pulse communication optical signal from the laser diode.

2. The laser diode communication circuit of claim 1, wherein the spectral-shaping low-pass filter includes:
   a second operational amplifier having an input node and an output node;
   a FET having an input coupled to the input pulse communication signal and an output coupled to the input node of the second operational amplifier;
   a resistive current-setting network coupled to the input node of the second operational amplifier; and
   a low-pass filter network coupled between the output of the second operational amplifier and the input of the operational amplifier.

3. The laser diode communication circuit of claim 2, wherein the resistive current-setting network controls the voltage output ratio from the second operational amplifier.

4. The laser diode communication circuit of claim 3, wherein the resistive current-setting network includes at least two resistors, a first resistor that controls current flow into the second operational amplifier when the FET is off, and a second resistor that controls current flow into the second operational amplifier when the FET is on.

5. The laser diode communication circuit of claim 4, wherein the ratio of the ohmic values of the second resistor to the first resistor is approximately 10 to 1.

6. The laser diode communication circuit of claim 2, wherein the low-pass filter implements a Bessel-filter function.

7. The laser diode communication circuit of claim 1, wherein the current source includes a bipolar junction transistor (BJT) having a base, and emitter, and a collector, and a resistor, wherein the base of the BJT is coupled to the output of the first operational amplifier, the emitter of the BJT is coupled to the resistor, and the collector of the BJT is coupled to the laser diode.

8. The laser diode communication circuit of claim 1, further comprising:
   a compensation capacitor coupled between the output and the input of the first operational amplifier.

9. The laser diode communication circuit of claim 1, further comprising:
   a fiber-optic cable coupled to the laser diode in order to transport optical pulses from the laser diode to a receiver circuit.

10. The laser diode communication circuit of claim 1, wherein the first operational amplifier includes an inverting input and a non-inverting input, and the input pulse communication signal is coupled to the inverting input of the first operational amplifier.

11. The laser diode communication circuit of claim 10, wherein the non-inverting input of the first operational amplifier is connected to ground.

* * * * *